(12) United States Patent
Takemura et al.

(10) Patent No.: US 11,862,747 B2
(45) Date of Patent: Jan. 2, 2024

(54) SEMICONDUCTOR LIGHT-RECEIVING ELEMENT AND METHOD OF MANUFACTURING SEMICONDUCTOR LIGHT-RECEIVING ELEMENT

(71) Applicant: Mitsubishi Electric Corporation, Tokyo (JP)

(72) Inventors: Ryota Takemura, Tokyo (JP); Matobu Kikuchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 192 days.

(21) Appl. No.: 17/420,619

(22) PCT Filed: Apr. 5, 2019

(86) PCT No.: PCT/JP2019/015157
§ 371 (c)(1),
(2) Date: Jul. 2, 2021

(87) PCT Pub. No.: WO2020/202557
PCT Pub. Date: Oct. 8, 2020

(65) Prior Publication Data
US 2022/0109080 A1    Apr. 7, 2022

(51) Int. Cl.
*H01L 31/107*        (2006.01)
(52) U.S. Cl.
CPC ................... *H01L 31/1075* (2013.01)
(58) Field of Classification Search
CPC ........... H01L 31/1075; H01L 31/02161; H01L 31/03042; H01L 31/03046; H01L 31/035272
See application file for complete search history.

(56) References Cited

U.S. PATENT DOCUMENTS 5,179,431 A    1/1993  Shirai
5,783,838 A *  7/1998  Kyozuka ............... B82Y 20/00
                                              257/E31.034
(Continued)

FOREIGN PATENT DOCUMENTS

CN    109216495 A  *  1/2019  ............. G01S 17/02
CN    111092073 A  *  5/2020
(Continued)

OTHER PUBLICATIONS

An Office Action; "Notice of Reasons for Refusal", mailed by the Japanese Patent Office dated Apr. 5, 2022, which corresponds to Japanese Patent Application No. 2021-511058 and is related to U.S. Appl. No. 17/420,619; with English language translation.

*Primary Examiner* — Sitaramarao S Yechuri
(74) *Attorney, Agent, or Firm* — Studebaker & Brackett PC

(57) ABSTRACT

A semiconductor light-receiving element (50) is a semiconductor light-receiving element in which a multi-plication layer (2), an electric-field control layer (3), a light absorption layer (4) and a window layer (5) are sequentially formed on a semiconductor substrate (1), and a p-type region (6) is formed in the window layer (5). The p-type region (6) has a first p-type portion (14) and a second p-type portion (15) whose current multiplication factor due to light incidence is larger than that of the first p-type portion (14). The first p-type portion (14) is formed as a central portion of the p-type region (6), the central portion including a central axis (21c) perpendicular to the semiconductor substrate (1), and the second p-type portion (15) is formed on an outer periphery of the central portion in a radial direction about the central axis (21c).

20 Claims, 9 Drawing Sheets

(56) References Cited

U.S. PATENT DOCUMENTS

| | | | | |
|---|---|---|---|---|
| 2006/0105554 | A1* | 5/2006 | Inada | H01L 21/32 257/E21.258 |
| 2008/0121867 | A1* | 5/2008 | Yagyu | H01L 31/03529 257/E31.039 |
| 2008/0265276 | A1* | 10/2008 | Noda | H01L 29/7397 257/E29.197 |
| 2013/0299936 | A1 | 11/2013 | Takemura et al. | |
| 2014/0339580 | A1* | 11/2014 | Park | H01L 33/08 257/90 |
| 2016/0218139 | A1* | 7/2016 | Ettenberg | H01L 29/808 |
| 2020/0203544 | A1 | 6/2020 | Takemura et al. | |
| 2020/0292379 | A1 | 9/2020 | Nakajima | |

FOREIGN PATENT DOCUMENTS

| | | | |
|---|---|---|---|
| JP | H02-010780 A | 1/1990 | |
| JP | H05-327003 A | 12/1993 | |
| JP | 2763352 B2 | 6/1998 | |
| JP | 2002-057364 A | 2/2002 | |
| JP | 2008-021725 A | 1/2008 | |
| JP | 4166560 B2 | 10/2008 | |
| JP | 2010-268000 A | 11/2010 | |
| JP | 2010268000 A * | 11/2010 | |
| JP | 2013-236012 A | 11/2013 | |
| JP | 2013236012 A * | 11/2013 | H01L 31/107 |
| JP | 2018-152369 A | 9/2018 | |
| TW | I649861 B | 2/2019 | |
| WO | 2019/053877 A1 | 3/2019 | |

\* cited by examiner

|  | Vbr [V] | Vre [V] | Multiplication Factor |
|---|---|---|---|
| 1st p-type portion in light receiving region | 35.16 | 15.78 | 6.7 |
| 2nd p-type portion in light receiving region | 33.46 | 14.60 | 9.6 |

SEMICONDUCTOR LIGHT-RECEIVING ELEMENT AND METHOD OF MANUFACTURING SEMICONDUCTOR LIGHT-RECEIVING ELEMENT

TECHNICAL FIELD

The present application relates to a semiconductor light-receiving element and a method of manufacturing the semiconductor light-receiving element.

BACKGROUND ART

As a semiconductor light-receiving element employed in optical communications, etc., an avalanche photodiode (APD), that is one type of photodiode (PD), is often used. Where appropriate, a photodiode and an avalanche photodiode will be referred to as a PD and an APD, respectively. In the case of an APD, when the electric field intensity in its multiplication layer is increased by voltage application, avalanche multi-plication occurs and thus, it is possible to amplify carriers. Namely out of carriers generated in its light absorption layer due to incident light, those having reached the multiplication layer can be amplified, so that there is a feature capable of improving the S/N ratio as a receiver. Accordingly; the APD is employed, in particular, in long-range communication application in many cases.

APDs for optical communication application are roughly classified into two types, depending on what material is used for the multiplication layer. In FIG. 3 of Patent Document 3, an APD using InP for the multiplication layer (first APD) is disclosed, and in FIG. 1 of Patent Document 1, an APD using a material containing Al (aluminum), such as InAlAs or the like, for the multiplication layer (second APD) is disclosed. Note that InAlAs is also referred to as AlInAs. In the first APD disclosed in FIG. 3 of Patent Document 1, an n-type InP layer, an n-type light absorption layer, an n-type multiplication layer and an n-type InP layer are sequentially stacked on an n-type InP substrate; a p+ region is formed in the InP layer on the front-surface side (on the opposite side from the InP substrate); and a guard ring portion (guard ring) as a p– region is formed around the p+ region. The APD whose multiplication layer is made of InP can multiply holes having reached the multiplication layer from the light absorption layer, when the electric field intensity in the multiplication layer is increased. Namely, the APl) whose multiplication layer is made of InP is of a hole-multiplication type. The guard ring serve: to prevent abrupt multiplication at an edge portion of the p+ region on the outer peripheral side thereof, that is, edge breakdown; or to function as a current path at the time the amount of input light increases momentarily thus causing reach-through at an edge portion of the p+ region earlier than at the center of the p+ region, to thereby prevent breakage of the p+ region due to current concentration therein.

In the second APD disclosed in FIG. 1 of Patent Document 1, an n-type InP layer, an n-type multiplication layer, an n-type light absorption layer and an n-type InP layer are sequentially stacked on an n-type InP substrate; a p+ region is formed in the InP layer on the front-surface side; and a guard ring portion (guard ring) as a p– region is formed around the p+ region. An APD whose multiplication layer is made of an Al-based material is of an electron-multiplication type. An electron is smaller in effective mass and higher in transfer rate than the hole, so that the electron-multiplication type APD is expected to achieve a higher-speed and lower-noise operation than in the case of the hole-multiplication type APD. For that reason, with the increase in the bit rate required for semiconductor light-receiving elements for optical communications, the electron-multiplication type APDs are becoming in widespread use.

CITATION LIST

Patent Document

Patent Document 1: Japanese Patent Application Laid-open No. H02-010780 (FIG. 1, FIG. 3)

SUMMARY OF INVENTION

Problems to be Solved by Invention

According to the electron-multiplication type APD (second APD) disclosed in FIG. 1 of Patent Document 1, because the multiplication layer is located on the lower side of the light absorption layer (on its side facing toward the semiconductor substrate), it is different in structure from the hole-multiplication type API) (first APD) in which the multiplication layer is located on the upper side of the light absorption layer (on its side opposite from the semiconductor substrate). In the electron-multiplication type APD disclosed in FIG. 1 of Patent Document 1, the multiplication layer is positioned between the semiconductor substrate and the light absorption layer, and the depth of the guard ring portion as the p– region is the same as the depth of the p+ region (p-type region) formed in a light receiving region through which the incident light passes, so that the guard ring portion does not reach the multiplication layer. Further, in Patent Document 1, there is no mention on the function of the guard ring portion in the electron-multiplication type APD (second APD). The guard ring portion in the electron-multiplication type APD (second APD) cannot exert such a function that is the same as that by the guard ring portion in the structurally different hole-multiplication type APD (first APD).

In the electron-multiplication type APD disclosed in FIG. 1 of Patent Document 1, the p+ region (p-type region) is surrounded by the p– region, so that the multiplication factor due to light incidence is high at around the central portion of the p+ region (p-type region). In general, the positions of the optical fiber for propagating light and the APD are adjusted so that the density of light incident on the light receiving region in the APD is highest in the central portion in the light receiving region. Thus, in the electron-multiplication type APD disclosed in FIG. 1 of Patent Document 1, when high-intensity light suddenly enters into the p-type region in the light receiving region, because of a synergistic effect due to the fact that the multiplication layer is positioned between the semiconductor substrate and the light absorption layer and the fact that the multiplication factor at the central portion of the p-type region is high, the carriers generated in the central portion of the p-type region are multiplied significantly so that the excessive photo-electric current flowing through the central portion of the p-type region increases. According to the electron-multiplication type APD disclosed in FIG. 1 of Patent Document 1, there is a problem that, when high-intensity light is incident on the p-type region in the light receiving region, the excessive photo-electric current increases in the central portion of the p-type region, so that the APD generates heat and is thus likely to be deteriorated in characteristics.

A technique disclosed in the present description is intended to provide a semiconductor light-receiving element which can suppress the deterioration in characteristics if excessive light is incident on the p-type region formed in the light receiving region subject to incident light.

Means for Solving the Problems

In a semiconductor light-receiving element disclosed as an example in this description, a multiplication layer, an electric-field control layer, a light absorption layer and a window layer are sequentially formed on a semiconductor substrate, and a p-type region is formed in the window layer. The p-type region has a first p-type portion and a second p-type portion whose current multiplication factor due to light incidence is larger than that of the first p-type portion. The first p-type portion is formed as a central portion of the p-type region, said central portion including a central axis perpendicular to the semiconductor substrate, and the second p-type portion is formed on an outer periphery of the central portion in a radial direction about the central axis.

Effect of Invention

According to the semiconductor light-receiving element disclosed as an example in the present description, the p-type region has the first p-type portion formed as the central portion, and the second p-type portion on the outer periphery of the central portion, whose current multiplication factor due to light incidence is larger than that of the first p-type portion. Thus, it is possible to suppress the deterioration in characteristics if excessive light is incident on the p-type region formed in the light receiving region subject to incident light.

MODES FOR CARRYING OUT INVENTION

Embodiment 1

Figures 1, 2:
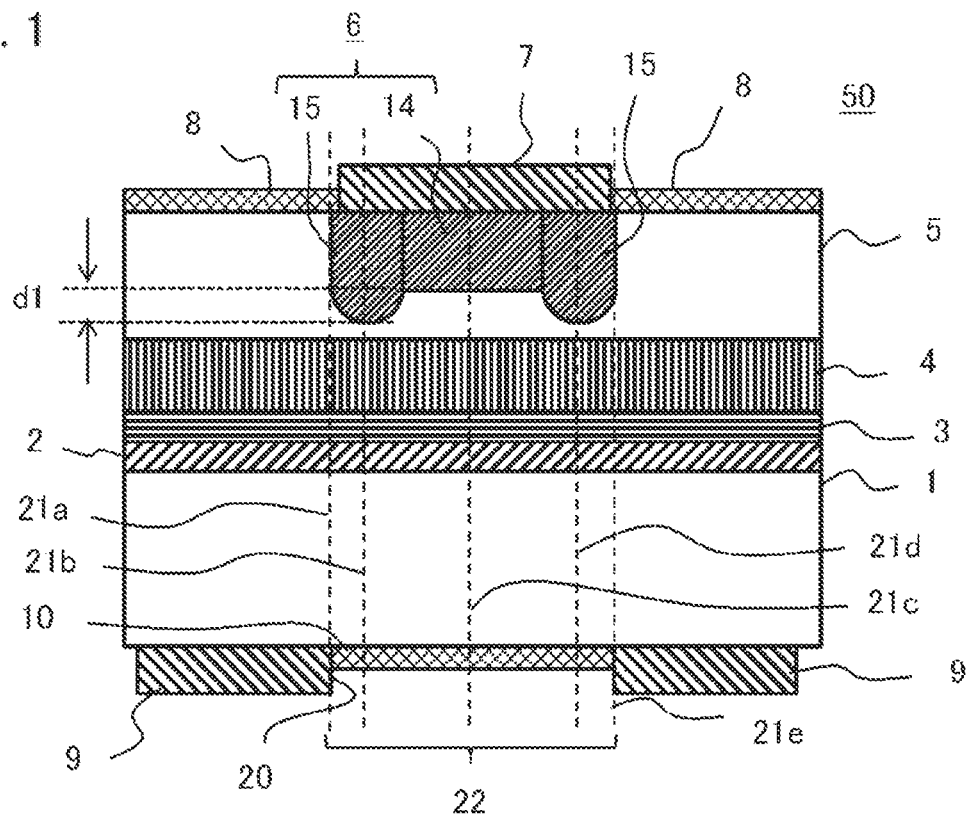
FIG. 1 is a sectional view showing a schematic configuration of a first semiconductor light-receiving element according to Embodiment 1.
FIG. 2 is a diagram showing calculation results of breakdown voltages and reach-through voltages of the semiconductor light-receiving element of FIG. 1.
Figure 3:
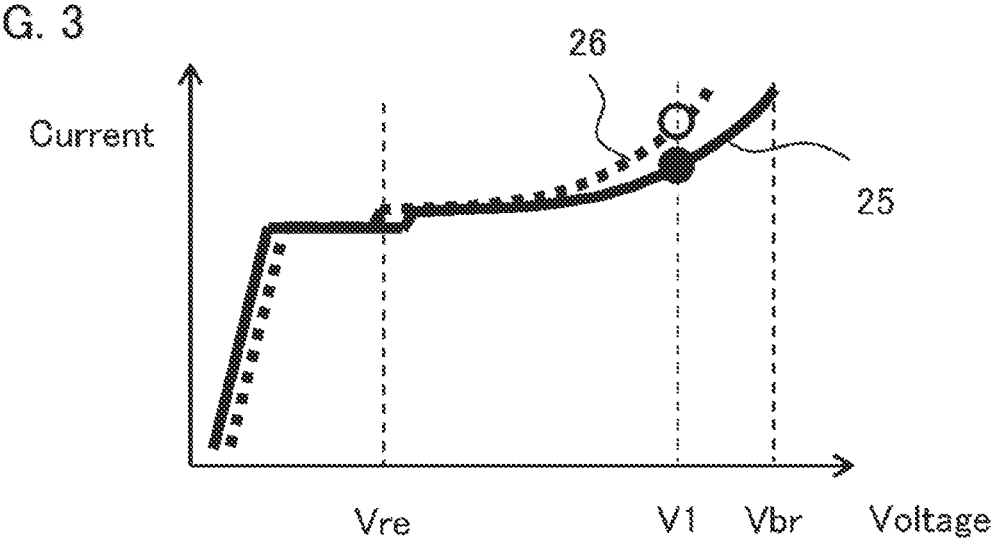
FIG. 3 is a graph showing current characteristics of the semiconductor light-receiving element of FIG. 1.
Figure 4:
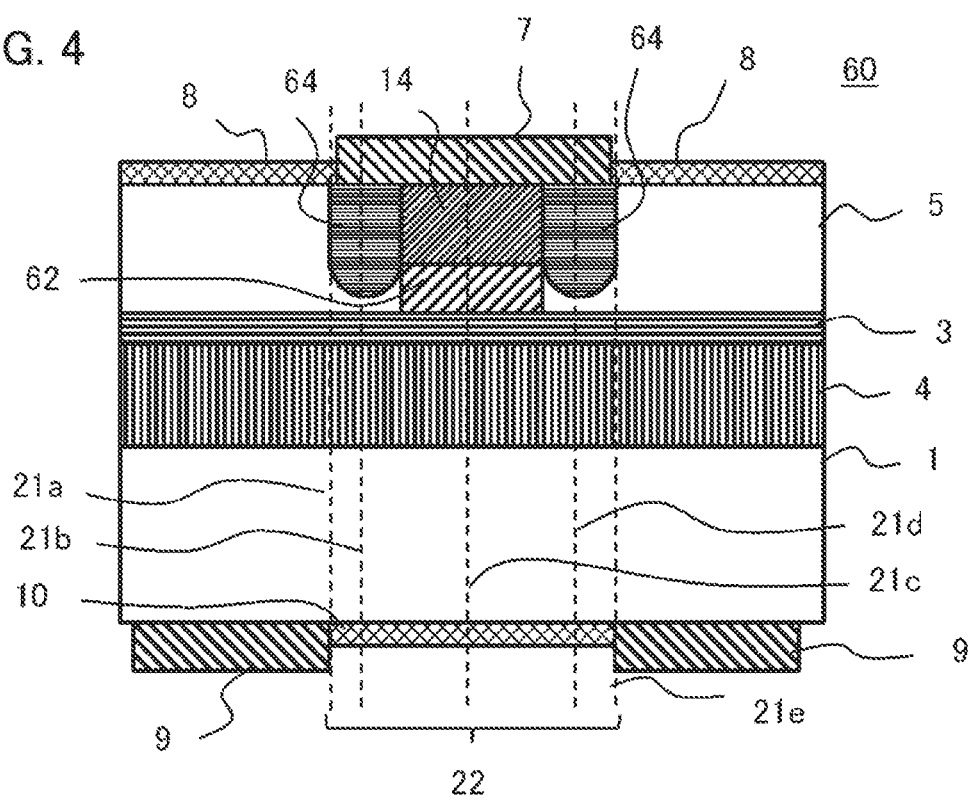
FIG. 4 is a sectional view showing a schematic configuration of a semiconductor light-receiving element as a comparative example.
Figure 5:
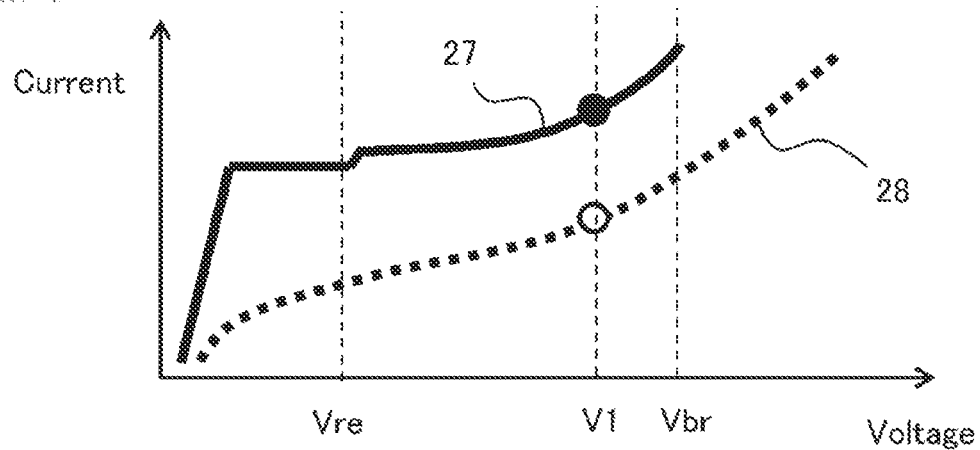
FIG. 5 is a graph showing current characteristics of the semiconductor light-receiving element of FIG. 4.
Figure 6:
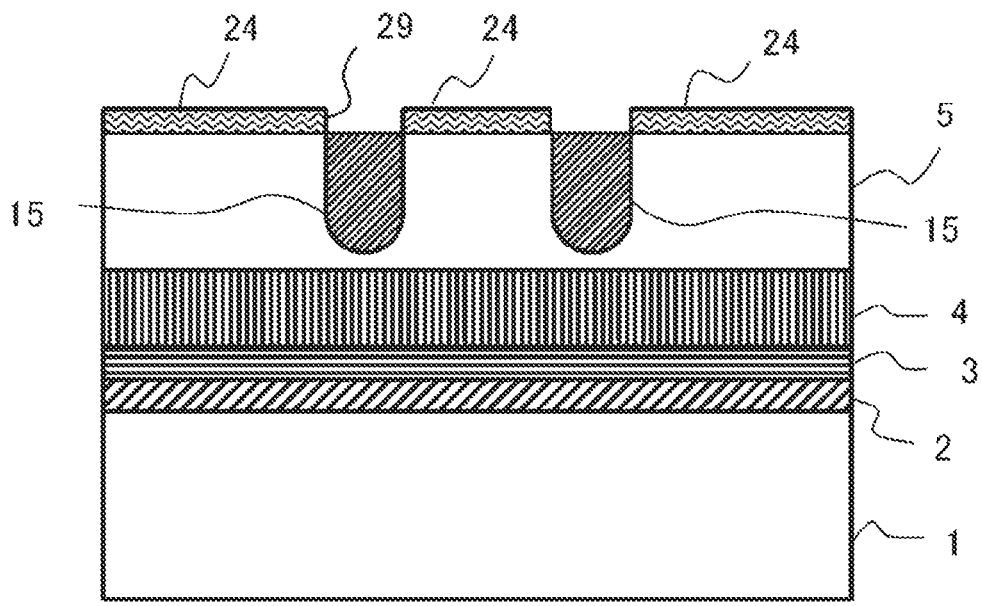
FIG. 6 is a diagram illustrating a diffusion step for forming a p-type region in FIG. 1.
Figure 7:
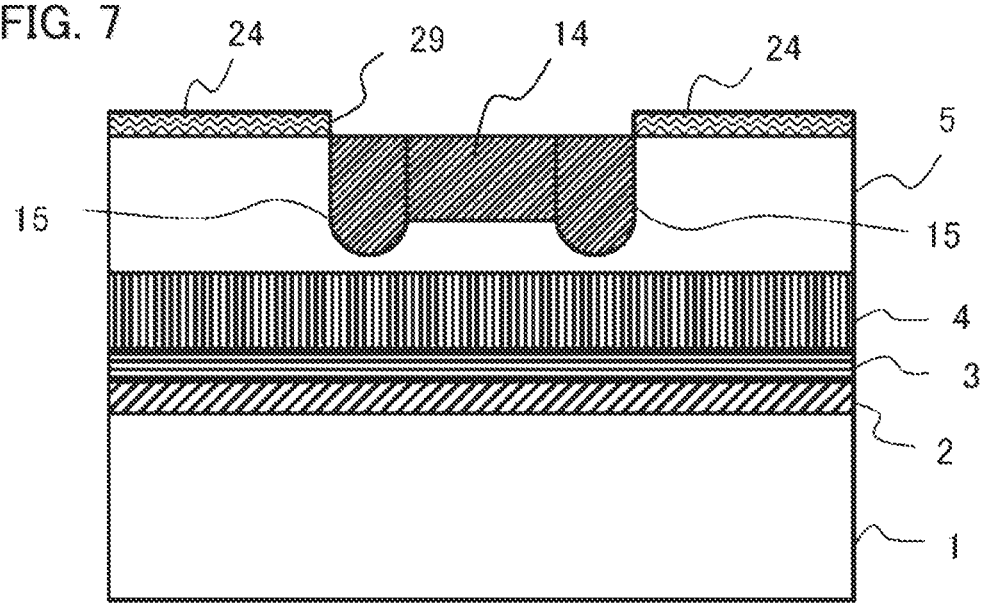
FIG. 7 is a diagram illustrating a diffusion step for forming the p-type region in FIG. 1.
Figure 8:
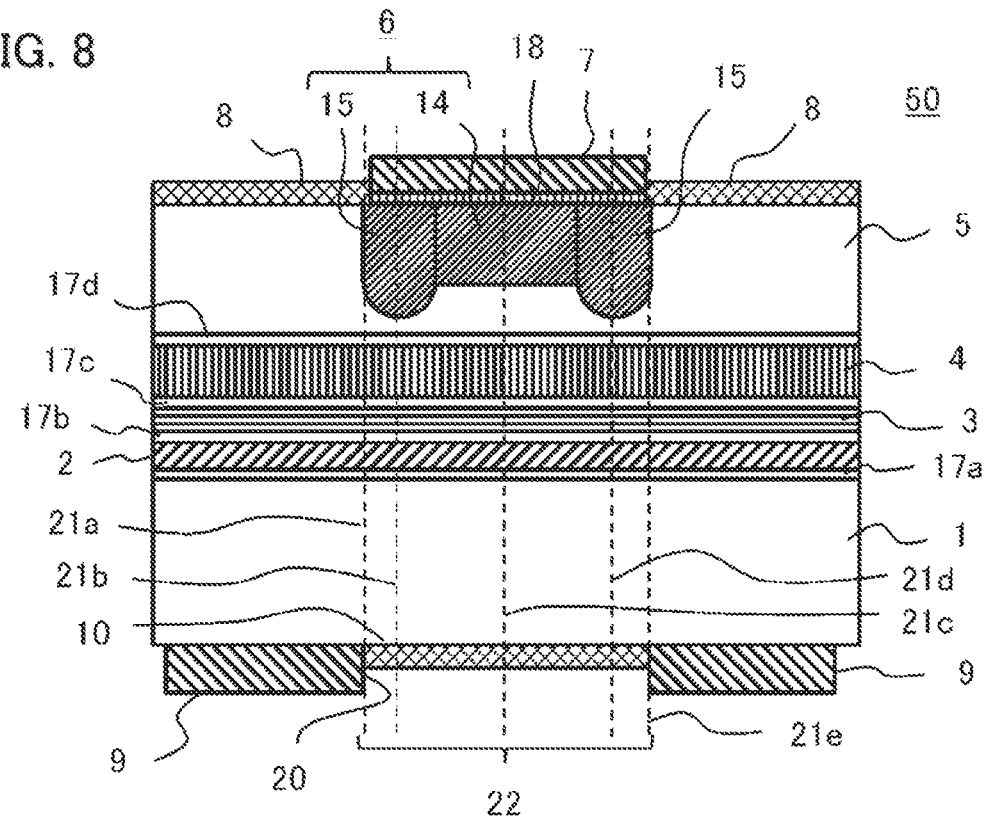
FIG. 8 is a sectional view showing a schematic configuration of a second semiconductor light-receiving element according to Embodiment 1.
Figure 9:
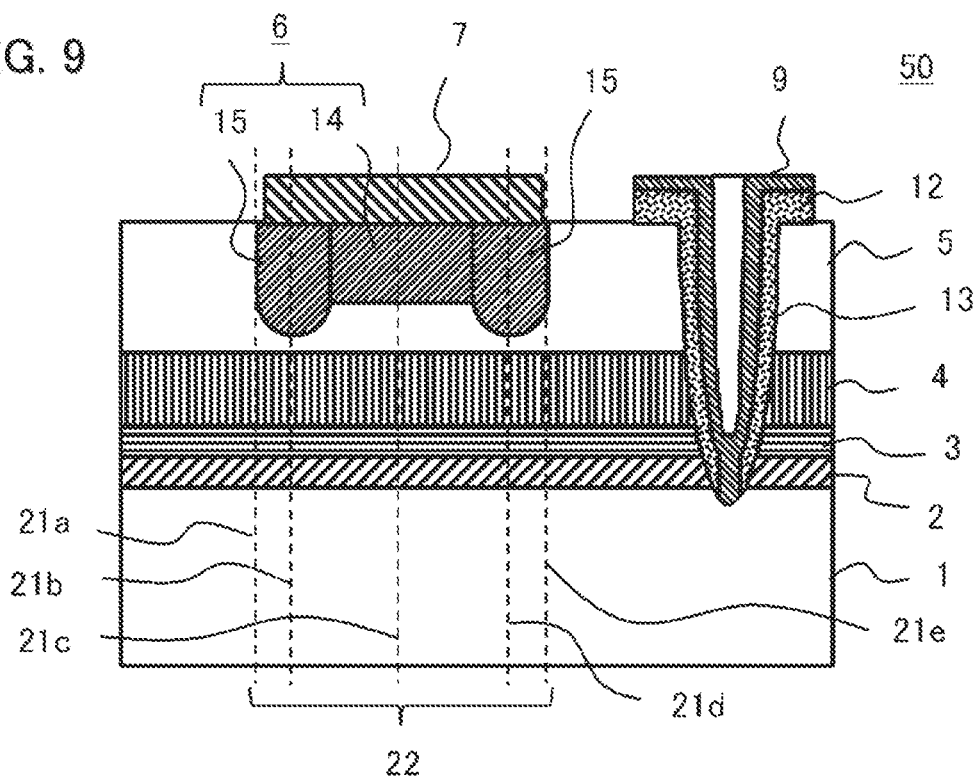
FIG. 9 is a sectional view showing a schematic configuration of a third semiconductor light-receiving element according to Embodiment 1.
Figure 10:
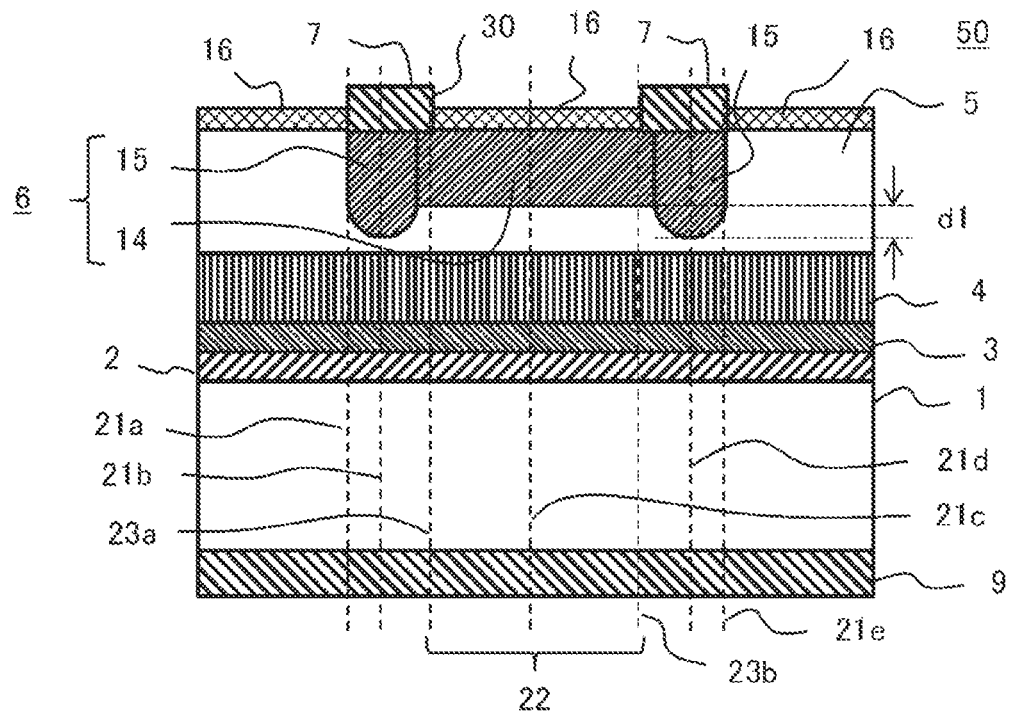
FIG. 10 is a sectional view showing a schematic configuration of a fourth semiconductor light-receiving element according to Embodiment 1.

A semiconductor light-receiving element 50 of Embodiment 1 will be described with reference to the drawings. For the same or equivalent configuration elements herein, the same reference numerals will be given, so that repetitive description thereof will be omitted as the case may be. FIG. 1 is a sectional view showing a schematic configuration of a first semiconductor light-receiving element according to Embodiment 1. FIG. 2 is a diagram showing calculation results of breakdown voltages and reach-through voltages of the semiconductor light-receiving element of FIG. 1, and FIG. 3 is a graph showing current characteristics of the semiconductor light-receiving element of FIG. 1, FIG. 4 is a sectional view showing a schematic configuration of a semiconductor light-receiving element as a comparative example, and FIG. 5 is a graph showing current characteristics of the semiconductor light-receiving element of FIG. 4. FIG. 6 and FIG. 7 are diagrams illustrating diffusion steps for forming a p-type region in FIG. 1. FIG. 8 is a sectional view showing a schematic configuration of a second semiconductor light-receiving element according to Embodiment 1, and FIG. 9 is a sectional view showing a schematic configuration of a third semiconductor light-receiving element according to Embodiment 1. FIG. 10 is a sectional view showing a schematic configuration of a fourth semiconductor light-receiving element according to Embodiment 1. On the surface of a semiconductor substrate 1 provided as an n-type InP substrate, an n-type AlInAs multiplication layer 2 containing Al (aluminum), a p-type InP electric-field control layer 3, an n-type InGaAs light absorption layer 4 and an n-type InP window layer 5 are stacked sequentially. A p-type region 6 is formed partly in the window layer 5, and a vertical structure region including the p-type region 6 is provided as a light receiving region 22. In FIG. 1, the light receiving region 22 is a region from a broken line 21*a* to a broken line 21*e*, and the surface shape of the p-type region 6 is a circular shape, for example.

On the surface of the window layer 5 (a surface on the opposite side from the semiconductor substrate 1), a passivation film 8 of SiN, $SiO_2$ or the like is formed, and on the surface of the p-type region 6, an anode electrode 7 is formed. The p-type region 6 and the anode electrode 7 are electrically connected to each other. On the back surface of the semiconductor substrate 1, a cathode electrode 9 and an anti-reflection film 10 are formed. The back surface of the semiconductor substrate 1 and the cathode electrode 9 are electrically connected to each other. A shape of the cathode electrode 9 viewed from the back side of the semiconductor light-receiving element 50 (back surface shape) is, for example, an oblong shape; a circular opening 20 is created in that electrode; and the anti-reflection film 10 is formed on the back surface of the semiconductor substrate 1 inside the opening 20. The back surface shape of the anti-reflection film 10 is a circular shape. In FIG. 1, a case is shown where the outer periphery of the p-type region 6 in a radial direction about a central axis 21c coincides with the outer periphery of the anti-reflection film 10 in the radial direction. The semiconductor light-receiving element 50 shown in FIG. 1 is an avalanche photodiode of a back-surface incident type on which light is incident from the back side of the semiconductor substrate 1.

The multiplication layer 2, the electric-field control layer 3, the light absorption layer 4 and the window layer 5 are each an epitaxial layer formed using an MOCVD (Metal Organic Chemical Vapor Deposition) apparatus, an MBE (Molecular Beam Epitaxy) apparatus or the like. The passivation film 8 is formed using a photolithographic technique and an etching technique, after film deposition by use of a vapor deposition apparatus, a sputtering apparatus, a CVD (Chemical Vapor Deposition) apparatus or the like. The anode electrode 7 and the cathode electrode 9 are each formed using a photolithographic technique and an etching technique, after film deposition by use of a vapor deposition apparatus, a sputtering apparatus or the like. The anti-reflection film 10 is formed using a sputtering apparatus, a vapor deposition apparatus, a CVD apparatus, an MBE apparatus or the like.

The p-type region 6 is formed in a part above the interface between the light absorption layer 4 and the window layer 5, namely it is formed in an inner part of the window layer 5 to be spaced apart from the interface. The p-type region 6 has: a first p-type portion 14 whose depth in the stacked direction of the epitaxial layers is shallow; and a second p-type portion 15 whose depth in the stacked direction of the epitaxial layers is deeper than that of the first p-type portion 14. The second p-type portion 15 extends toward the semiconductor substrate 1 further than the first p-type portion 14. Further, the second p-type portion 15 is formed as an outermost peripheral portion of the p-type region 6 in the radial direction. The diffusion fronts of the first p-type portion 14 and the second p-type portion 15 are each located above the interface between the light absorption layer 4 and the window layer 5, and are thus created as inner parts of the window layer 5 spaced apart from the interface between the light absorption layer 4 and the window layer 5. Note that the "diffusion front" shall be indicative of a depth-direction boundary between a dopant diffused portion and a dopant non-diffused portion that are provided when dopants are diffused from the surface of the epitaxial layers (a surface through which diffusion sources containing the dopants may enter).

The surface shape of the first p-type portion 14 is a circular shape, and the surface shape of the second p-type portion 15 is a ring shape that surrounds the outer periphery of the first p-type portion 14. The diffusion front of the second p-type portion 15 is deepest at positions indicated by broken lines 21b, 21d. A broken line 21c indicates the central axis of the p-type region 6 and also the central axis of the light receiving region 22. The central axis 21c is perpendicular to the semiconductor substrate 1, and light will be incident on the semiconductor light-receiving element 50 in a direction, for example, parallel to the central axis 21c. A diffusion-front difference d1 that is a distance between the diffusion front of the first p-type portion 14 and the diffusion front of the second p-type portion 15 may be any difference, and is, for example, not less than 1 nm but less than 100 nm. The carrier concentration (impurity concentration) of the p-type region 6 is, for example, about $5 \times 10^{17}$ cm$^{-3}$. It can also be said that the diffusion-front difference d1 is a differential distance in the direction of the central axis 21c between an end portion in the first p-type portion 14 that is closest to the semiconductor substrate 1 and an end portion in the second p-type portion 15 that is closest to the semiconductor substrate 1.

When the diffusion front of the second p-type portion 15 is made deeper than the diffusion front of the central portion of the p-type region 6 including the central axis 21c, namely, the first p-type portion 14, it is possible to make differences between breakdown voltages (Vbr) as well as reach-through voltages (Vre) of the APD at the central portion and the outer peripheral portion of the p-type region 6, namely at a central portion and an outer peripheral portion in the light receiving region 22. Using FIG. 2 and FIG. 3, characteristics of the first p-type portion 14 and the second p-type portion 15 will be described. In FIG. 2, calculation results of breakdown voltages (Vbr), reach-through voltages (Vre) and multiplication factors are shown. In FIG. 3, current characteristics of the semiconductor light-receiving element 50 are shown schematically. In FIG. 3, the abscissa and the ordinate represent a voltage and a current, respectively. As shown in FIG. 2, the breakdown voltage (Vbr), the reach-through voltage (Vre) and the multiplication factor at the first p-type portion 14 are 35.16 V, 15.78 V and 6.7, respectively. The breakdown voltage (Vbr), the reach-through voltage (Vre) and the multiplication factor at the second p-type portion 15 are 33.46 V, 14.60 V and 9.6, respectively. The multiplication factor due to light incidence is the ratio between a current I0 before the occurrence of avalanche multi-plication and a current I1 under the occurrence of avalanche multi-plication, and is represented as I1/I0. The values of the multiplication factors shown in FIG. 2 are values when a reverse bias of 30 V is applied between the anode electrode 7 and the cathode electrode 9. The symbol shown in FIG. 3 is the operation voltage of the semiconductor light-receiving element 50, which is 30 V, for example.

A current characteristic 25 in FIG. 3 is a current characteristic at a central portion of the first p-type portion 14, and a current characteristic 26 in FIG. 3 is a current characteristic of the second p-type portion 15. As shown in FIG. 3, the central portion in the light receiving region 22 and the outer peripheral portion in the light receiving region 22 have different current-voltage characteristics and also have different multiplication factors at the time of application of the same voltage. Thus, according to the semiconductor light-receiving element 50 of Embodiment 1, it is possible to make a difference between the multiplication factors of the central portion in the light receiving region 22 and the outer peripheral portion in the light receiving region 22, even at the same application voltage between the anode electrode 7 and the cathode electrode 9. Specifically, when a constant application voltage is applied between the anode electrode 7 and the cathode electrode 9, a condition is provided in which the multiplication factor of the central portion in the light receiving region 22, namely, the first p-type portion 14, is lower than that of the outer peripheral portion in the light receiving region 22, namely, the second p-type portion 15. As mentioned above, the multiplication factor indicates a rate of increase due to the current generated by input light, namely, how many times larger the number of carriers to be outputted becomes. This means that the larger the multiplication factor is, the larger the flowing photo-electric current becomes even at the same input light.

As described previously in general, the positions of the optical fiber for propagating light and the APD are adjusted so that the density of light incident on the light receiving region 22 in the APD is highest in the central portion in the light receiving region 22. Accordingly, at the time light is inputted, the light density is high in the central portion in the light receiving region 22, in particular, at the center indicated by the broken line 21c, so that many carriers are generated in the central portion in the light receiving region 22 and, as the result, the current flowing through the central portion in the light receiving region 22 becomes larger. This phenomenon is significant particularly at the center indicated by the broken line 21c. Thus, when light is inputted excessively, the photo-electric current flowing through the central portion in the light receiving region 22 increases, so that a case may arise that heat is generated with the increase of the photo-electric current to cause the deterioration in characteristics. However, according to the semiconductor light-receiving element 50 of Embodiment 1, the multiplication factor of the central portion in the light receiving region 22, namely the first p-type portion 14, is lower than that of the outer peripheral portion in the light receiving region 22, namely the second p-type portion 15. Thus, the photo-electric current flowing through the second p-type portion 15 in the light receiving region 22 increases and the photo-electric current flowing through the first p-type portion 14 in the light receiving region 22 decreases, so that, if an excessive current is generated, the photo-electric current is less likely to concentrate in the first p-type portion 14 in the light receiving region 22, and this makes it possible to suppress the deterioration in characteristics due to generated heat.

Description will be made about current characteristics of a semiconductor light-receiving element 60 as a comparative example in which a guard ring 64 is formed. The semiconductor light-receiving element 60 shown in FIG. 4 differs from the semiconductor light-receiving element 50 of FIG. 1 in that the electric-field control layer 3 is formed on the surface of the light absorption layer 4, a multiplication layer 62 and the window layer 5 are formed on the surface of the electric-field control layer 3, and the guard ring 64 is formed on the outer periphery of the first p-type portion 14. The back side of the first p-type portion 14 (its side facing toward the semiconductor substrate 1) is in contact with the n-type multiplication layer 62. The diffusion front of the guard ring 64 is deepest at the positions indicated by the broken lines 21b, 21d. In the semiconductor light-receiving element 60 of the comparative example, the multiplication layer 62 is made of InP, and the impurity concentration of the guard ring 64 is lower than that of the first p-type portion 14. According to the semiconductor light-receiving element 60 of the comparative example, when light is incident thereon, no avalanche multiplication occurs beneath the guard ring 64, so that it operates as a PD which does not cause avalanche multiplication beneath the guard ring 64.

In FIG. 5, current characteristics of the semiconductor light-receiving element 60 of the comparative example are shown schematically. In FIG. 5, the abscissa and the ordinate represent a voltage and a current, respectively. A current characteristic 27 in FIG. 5 is a current characteristic at a central portion of the first p-type portion 14, and a current characteristic 28 in FIG. 5 is a current characteristic of the guard ring 64. As shown in FIG. 5, the semiconductor light-receiving element 60 of the comparative example is structured so that the photo-electric current in the guard ring 64 as an outer peripheral portion in the light receiving region 22 is less than the photo-electric current in the central portion in the light receiving region 22, and thus the multiplication factor of the guard ring 64 as the outer peripheral portion in the light receiving region 22 is lower than the multiplication factor of the central portion in the light receiving region 22. Note that, since no avalanche multiplication occurs beneath the guard ring 64, the multiplication factor of the outer peripheral portion in the light receiving region 22 is 1. Therefore, distributions according to the current characteristics of the central portion and the outer peripheral portion in the light receiving region 22 in the semiconductor light-receiving element 60 of the comparative example, are in inverse relation to those according to the current characteristics of the central portion and the outer peripheral portion in the light receiving region 22 in the semiconductor light-receiving element 50 of Embodiment 1. In this manner, the guard ring 64 in the semiconductor light-receiving element 60 of the comparative example in which the multiplication layer 62 is made of InP, differs in function from the second p-type portion 15 as the outer peripheral portion in the light receiving region 22 in the semiconductor light-receiving element 50 of Embodiment 1.

Thus, the semiconductor light-receiving element 60 of the comparative example does not achieve an effect according to the semiconductor light-receiving element 50 of Embodiment 1, namely, an effect in which, even when high-intensity light is incident on the light receiving region 22 and an excessive current is generated therein, because a photo-electric current flowing through the second p-type portion 15 in the light receiving region 22 increases relative to a photo-electric current flowing through the first p-type portion 14 in the light receiving region 22, the excessive photo-electric current is less likely to concentrate in the first p-type portion 14 in the light receiving region 22, so that the deterioration in characteristics due to generated heat can be suppressed. Unlike the semiconductor light-receiving element 50 of Embodiment 1, according to the semiconductor light-receiving element 60 of the comparative example, when high-intensity light is incident on the light receiving region 22 and an excessive current is generated therein, the photo-electric current will concentrate in the first p-type portion 14 in the light receiving region 22, so that a case may arise that heat is generated with the increase of the photo-electric current to cause the deterioration in characteristics. For the semiconductor light-receiving element 60 of the comparative example, it is required to make the driving voltage lower than that of the semiconductor light-receiving element 50 of Embodiment 1, or to reduce the intensity of incident light.

According to the semiconductor light-receiving element 50 of Embodiment 1, it is possible to make the multiplication factor of the high light-density central portion (first p-type portion 14) in the light receiving region 22, lower than that of the outer peripheral portion (second p-type portion 15) in the light receiving region 22, to thereby suppress excessive multiplication in the central portion (first, p-type portion 14) in the light receiving region 22 at the time light is inputted excessively; so that the deterioration in characteristics due to generated heat can be suppressed. According to the semiconductor light-receiving element 50 of Embodiment 1, its characteristics are not deteriorated even when high-intensity light is incident on the light receiving region 22 and an excessive current is generated therein, namely, its resistance to excessive current or its resistance to excessively inputted light is high, so that its lifetime is longer than that of the semiconductor light-receiving element 60 of the comparative example. Further, since the resistance to excessive current or the resistance to excessively inputted light is high, the semiconductor light-receiving element 50 of Embodiment 1 can be operated with a higher degree of sensitivity by setting its operation voltage V1 higher than that of the semiconductor light-receiving element 60 of the comparative example.

It is noted that, by lowering the operation voltage V1 to decrease the multiplication factor as a whole, it is also possible to suppress the deterioration in characteristics due to generated heat. In this case, however, the photo-electric current decreases in the entire light receiving region 22, thus causing a problem that the receiving sensitivity is degraded. In contrast, according to the semiconductor light-receiving element 50 of Embodiment 1, since the multiplication factor of the outer peripheral portion in the light receiving region 22 is high, even if the operation voltage V1 is lowered, a total amount of photo-electric current flowing through the entire light receiving region 22 is not decreased too much, so that such characteristic degradation due to the decrease of the photo-electric current is less likely to occur. Namely, when the operation voltage V1 is lowered, unlike the semiconductor light-receiving element 60 of the comparative example, the semiconductor light-receiving element 50 of Embodiment 1 can suppress characteristic degradation due to the decrease of the photo-electric current.

An example of the method of forming the p-type region 6 will be described using FIG. 6 and FIG. 7. The p-type region 6 is formed, for example, by two diffusion steps. The p-type region 6 is a region in which p-type dopants such as Zn (zinc), Be (beryllium) or the like are diffused. The p-type dopant used for the p-type region 6 may be other than Zn and Be. However, as the p-type dopant used for the p-type region 6, Zn is preferable. When the p-type dopant is Zn, the carrier concentration (impurity concentration) of the p-type region 6 can be easily increased and the diffusion front is easily controllable and thus, this dopant is well-suited for forming the structure of the p-type region 6 according to Embodiment 1, namely, the structure in which the diffusion front of the second p-type portion 15 is deeper than the diffusion front of the first p-type portion 14. When the p-type dopant is Zn (zinc), the p-type region 6 is a Zn(zinc)-diffused region.

FIG. 6 shows a state in which, after the formation of a layered body by sequentially stacking the multi-plication layer 2, the electric-field control layer 3, the light absorption layer 4 and the InP window layer 5 on the semiconductor substrate 1 (after a layered-body formation step), a diffusion prevention mask 24 has been formed and the p-type dopants have been diffused through an opening 29 of the diffusion prevention mask 24 to thereby form the second p-type portion 15. The opening 29 of the diffusion prevention mask 24 is formed into a ring shape. After the second p-type region 15 is formed in the window layer 5, the diffusion prevention mask 24 shown in FIG. 6 is removed and then a diffusion prevention mask 24 is newly formed as shown in FIG. 7. The diffusion prevention mask 24 shown in FIG. 7 is formed so that its opening 29 is conformed with the outer periphery of the second p-type portion 15. The p-type dopants are diffused through the opening 29 of the diffusion prevention mask 24 to thereby form the first p-type portion 14. FIG. 6 shows a second p-type portion formation step of forming the second p-type portion 15 of the p-type region, and FIG. 7 shows a first p-type portion formation step of forming the first p-type portion 14 of the p-type region 6 after the second p-type portion formation step. Note that a p-type dopant concentration of the second p-type portion 15 is higher on its surface side than on the other side. It is noted that, in each of the figures illustrated with cross sections, illustration of how the second p-type portion 15 is spread in the horizontal direction (in a direction parallel to the semiconductor substrate 1) by diffusion, is omitted. Also, in FIG. 4, illustration of how the guard ring 64 is spread in the horizontal direction (in a direction parallel to the semiconductor substrate 1) by diffusion, is omitted.

As shown in FIG. 8, a contact layer 18 for lowering a contact resistance, made of AlGaInAs, InOaAsP, InGaAs or the like or any combination thereof, may be interposed between the p-type region 6 and the anode electrode 7. Further, at interface portions between the respective epitaxial layers, in order to relax the band discontinuity band-discontinuity relaxation layers 17a, 17b, 17c and 17d, each using InGaAsP, AlGaAs or the like, may be interposed. The band-discontinuity relaxation layer 17a is formed between the semiconductor substrate 1 and the multiplication layer 2, and the band-discontinuity relaxation layer 17b is formed between the multiplication layer 2 and the electric-field control layer 3. The band-discontinuity relaxation layer 17c is formed between the electric-field control layer 3 and the light absorption layer 4, and the band-discontinuity relaxation layer 17d is formed between the light absorption layer 4 and the window layer 5.

As shown in FIG. 9, similarly to the anode electrode 7, the cathode electrode 9 may be located, not on the back surface of the semiconductor substrate 1, but on the surface side of the window layer 5. The third semiconductor light-receiving element 50 of Embodiment 1 shown in FIG. 9 is provided with: a trench portion 13 that penetrates the window layer 5, the light absorption layer 4, the electric-field control layer 3 and the multiplication layer 2, to reach the semiconductor substrate 1: the cathode electrode 9 connected to the semiconductor substrate 1; and an insulating film 12 that insulates the cathode electrode 9 from the respective layers of the window layer 5, the light absorption layer 4, the electric-field control layer 3 and the multiplication layer 2. In FIG. 9, a case is shown where the anti-reflection film 10 is not formed on a back surface of semiconductor substrate 1 corresponding to the light receiving region 22, and the passivation film 8 is not formed on an area of the window layer 5 which is outside the light receiving region 22 and on which the cathode electrode 9 is not formed. Also, the semiconductor light-receiving element 50 in either FIG. 1 or FIG. 8 may not have the passivation film 8 and the anti-reflection film 10. Note that the semiconductor light-receiving element 50 may have a passivation film. 8 that is formed on a side surface of the epitaxial layers.

The semiconductor light-receiving element 50 is not limited to the back-surface incident type, and may instead be an avalanche photodiode of a front-surface incident type as shown in FIG. 10. The fourth semiconductor light-receiving element 50 of Embodiment 1 shown in FIG. 10 differs from the first semiconductor light-receiving element 50 of Embodiment 1 shown in FIG. 1, in the following points. In the fourth semiconductor light-receiving element 50, the cathode electrode 9 is formed on the back surface of the semiconductor substrate 1, the anode electrode 7 has a ring shape, and an anti-reflection film 16 is formed on a surface area of the window region 5 on which the anode electrode 7 is not formed. In the fourth semiconductor light-receiving element 50, a region corresponding to an opening 30 of the anode electrode 7, namely, an open region, is provided as a light receiving region 22. In FIG. 10, the light receiving region 22 ranges from a broken line 23a to a broken line 23b.

Because the fourth semiconductor light-receiving element 50 has the p-type region 6 whose structure is similar to that of the first semiconductor light-receiving element 50, it achieves an effect similar to that of the first semiconductor light-receiving element 50.

It is noted that, although a case has been described where the carrier concentration (impurity concentration) of the p-type region 6 is about $5\times10^{17}$ cm$^{-3}$, it is preferable that the carrier concentration (impurity concentration) of the p-type region 6 be $1\times10^{18}$ cm$^{-3}$ or more. The carrier concentration of the light absorption layer 4 is usually $1\times10^{10}$ cm$^{-3}$ or less, so that, when the carrier concentration of the p-type region 6 is low, the depletion layer width becomes unstable and thus a difference between the multi-plication factor of the second p-type portion 15 and the multiplication factor of the first p-type portion 14 cannot be established accurately. However, when the carrier concentration (impurity concentration) of the p-type region 6 is about $5\times10^{17}$ cm$^{-3}$, a difference between the multiplication factor of the second p-type portion 15 and the multiplication factor of the first p-type portion 14 can be established accurately. Further, when the carrier concentration (impurity concentration) of the p-type region 6 is $1\times10^{18}$ cm$^{-3}$ or more, a difference between the multiplication factor of the second p-type portion 15 and the multiplication factor of the first, p-type portion 14 can be established more accurately.

According to the semiconductor light-receiving elements 50 of Embodiment 1, since the carrier concentration (impurity concentration) of the p-type region 6 is about $5\times10^{17}$ cm$^{-3}$, it is possible to accurately determine the depletion layer width to be achieved when a bias is applied, so that the effect according to the first semiconductor light-receiving element 50 will be obtained stably. Further, according to the semiconductor light-receiving elements 50 of Embodiment 1, when the carrier concentration (impurity concentration) of the p-type region 6 is $1\times10^{18}$ cm$^{-3}$ or more, it is possible to more accurately determine the depletion layer width to be achieved when the bias is applied, so that the effect according to the first semiconductor light-receiving element 50 will be obtained more stably.

Although a case has been described where the p-type region 6 is formed by two diffusion steps, these steps may instead be one step. For example, the first p-type portion 14 may be formed concurrently with the second p-type portion 15, in such a manner that a central portion of the diffusion prevention mask 24 in FIG. 6, namely, a portion thereof under which the formation of the first p-type portion 14 is prevented, is replaced with a diffusion control mask in which the diffusion rate of the p-type dopant is low.

It is noted that the material of the light absorption layer 4 is not limited to InGaAs so long as it is a material that produces carriers when light is incident, namely, that has a small bandgap for the incident light, and thus may lie InGaAsP, InGaAsSb or the like, or the combination thereof. The window layer 5 may use any material so long as it produces no carrier when light is incident, namely that has a large bandgap for the incident, light, such as, AlInAs, AlGaInAs, InGaAsP or the like, or any combination thereof. The electric-field control layer 3 is not limited to being formed of InP and may be formed using AlInAs. Further, any type of material may be used for each of the epitaxial layers so long as a characteristic necessary for an operation as an APD is achieved thereby, and thus, the materials of the respective epitaxial layers are not limited to the materials that were used for the description.

As described above, the semiconductor light-receiving element 50 of Embodiment 1 is a semiconductor light-receiving element in which the multiplication layer 2, the electric-field control layer 3, the light absorption layer 4 and the window layer 5 are sequentially formed on the semiconductor substrate 1, and the p-type region 6 is formed in the window layer 5. The p-type region 6 has the first p-type portion 14 and the second p-type portion 15 whose current multiplication factor due to light incidence is larger than that of the first p-type portion 14. The first p-type portion 14 is formed as a central portion of the p-type region 6, said central portion including the central axis 21c perpendicular to the semiconductor substrate 1, and the second p-type portion 15 is formed on the outer periphery of the central portion in a radial direction about the central axis 21c. Because the p-type region 6 has the first p-type portion 14 formed as the central portion, and the second p-type portion 15 on the outer periphery of the central portion, whose current multiplication factor due to light incidence is larger than that of the first p-type portion 14, the semiconductor light-receiving element 50 of Embodiment 1 can suppress the deterioration in characteristics if excessive light is incident on the p-type region 6 formed in the light receiving region 22 subject to incident light.

A semiconductor light-receiving element manufacturing method of Embodiment 1 is a semiconductor light-receiving element manufacturing method of manufacturing the semiconductor light-receiving element 50 which comprises the semiconductor substrate 1, the multiplication layer 2, the electric-field control layer 3, the light absorption layer 4 and the window layer 5, and in which the p-type region 6 is formed in the window layer 5, said p-type region having the first p-type portion 14 and the second p-type portion 15 whose current multiplication factor due to light incidence is larger than that of the first p-type portion 14. The semiconductor light-receiving element manufacturing method of Embodiment 1 comprises: a step of forming the multiplication layer 2, the electric-field control layer 3, the light absorption layer 4 and the window layer 5, sequentially on the semiconductor substrate 1; a second p-type portion formation step of forming the second p-type portion 15 of the p-type region 6; and a first p-type portion formation step of forming, after the second first p-type portion formation step, the first p-type portion 14 of the p-type region 6. According to the semiconductor light-receiving element manufacturing method of Embodiment 1, it is possible to manufacture the semiconductor light-receiving element 50 in which the p-type region 6 has the first p-type portion 14 formed as the central portion, and the second p-type portion 15 on the outer periphery of the central portion, whose current multiplication factor due to light incidence is larger than that of the first p-type portion 14. Thus, it is possible to manufacture the semiconductor light-receiving element 50 which can suppress the deterioration in characteristics if excessive light is incident on the p-type region 6 formed in the light receiving region 22 subject to incident light.

In another aspect, a semiconductor light-receiving element manufacturing method of Embodiment 1 comprises: a step of stacking the multiplication layer 2, the electric-field control layer 3, the light absorption layer 4 and the window layer 5, sequentially on the semiconductor substrate 1, to thereby form a layered body; a second p-type portion formation step of forming the second p-type portion 15 of the p-type region 6; and a first p-type portion formation step of forming, after the second p-type portion formation step, the first p-type portion 14 of the p-type region 6. According to the semiconductor light-receiving element manufacturing method of Embodiment 1, it is possible to manufacture the semiconductor light-receiving element 50 in which the p-type region 6 has the first p-type portion 14 formed as the central portion, and the second p-type portion 15 on the outer periphery of the central portion, whose current multiplication factor due to light incidence is larger than that of the first p-type portion 14. Thus, it is possible to manufacture the semiconductor light-receiving element 50 which can suppress the deterioration in characteristics if excessive light is incident on the p-type region 6 formed in the light receiving region 22 subject to incident light.

Embodiment 2

Figure 11:
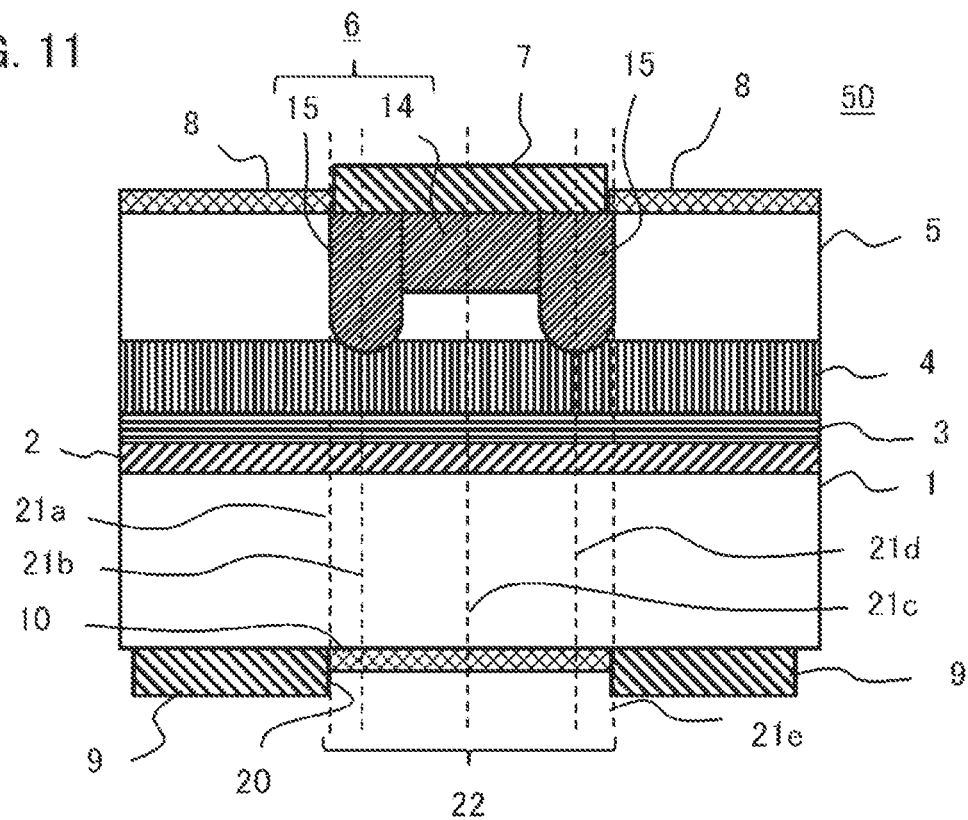
FIG. 11 is a sectional view showing a schematic configuration of a semiconductor light-receiving element according to Embodiment 2.
Figure 12:
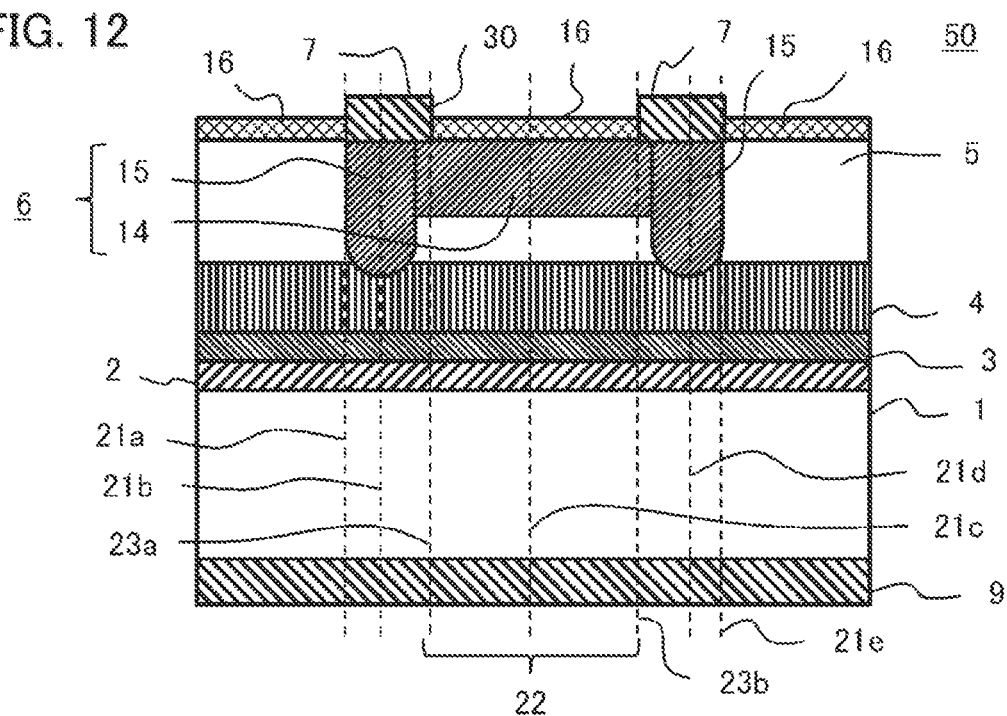
FIG. 12 is a sectional view showing a schematic configuration of another semiconductor light-receiving element according to Embodiment 2.

FIG. 11 is a sectional view showing a schematic configuration of a semiconductor light-receiving element according to Embodiment 2, and FIG. 12 is a sectional view showing a schematic configuration of another semiconductor light-receiving element according to Embodiment 2. Each semiconductor light-receiving element 50 of Embodiment 2 differs from the semiconductor light-receiving element 50 of Embodiment 1 in that the diffusion front of the second p-type portion 15 of the p-type region 6 is formed in the light absorption layer 4, namely, the second p-type portion 15 is formed to extend into the light absorption layer 4. The structure other than the above is similar to that in the semiconductor light-receiving element 50 of Embodiment 1. In the semiconductor light-receiving element 50 of Embodiment 2, like in the semiconductor light-receiving element 50 of Embodiment 1, the diffusion front of the first p-type portion 14 of the p-type region 6 is formed in the window layer 5 to be spaced apart from the interface between the light absorption layer 4 and the window layer 5. The semiconductor light-receiving element 50 shown in FIG. 11 is an avalanche photodiode of a back-surface incident type, and the semiconductor light-receiving element 50 shown in FIG. 12 is an avalanche photodiode of a front-surface incident type.

In the semiconductor light-receiving element 50 of Embodiment 2, like in the semiconductor light-receiving element 50 of Embodiment 1, there is a difference in bandgap between the light absorption layer 4 and the window layer 5, so that, when a reverse bias is applied between the anode electrode 7 and the cathode electrode 9, such a difference in bandgap functions as a barrier for holes generated in the light absorption layer 4. Namely, because of the difference in bandgap between the light absorption layer 4 and the window layer 5, the holes generated in the light absorption layer 4 will be less likely to flow to the first p-type portion 14. When the second p-type portion 15 is formed up to the inner side of the light absorption layer 4 beyond the interface between the light absorption layer 4 and the window layer 5, in a region where the second p-type portion 15 and the light absorption layer 4 are connected to each other, there is no connection portion between the light absorption layer 4 and the window layer 5, so that a bandgap between the second p-type portion 15 and the light absorption layer 4 is lower than a bandgap between portions of the light absorption layer 4 and the window layer 5 that are placed under the first p-type portion 14. In this case, because of such a lower barrier, it is easier for the holes generated in the light absorption layer 4 to move, after traveling in the light absorption layer 4, to the second p-type portion 15 in which holes are provided as majority carriers, than to move to the window layer 5 from the light absorption layer 4. Thus, the holes generated in the light absorption layer 4 are likely to flow to the second p-type portion 15 that is formed up to a position in the light absorption layer 4 and thus has the lower barrier. Namely, the holes generated in the light absorption layer 4 tend to flow through the second p-type portion 15 of the p-type region 6. This means that the photo-electric current flowing through the first p-type portion 14 in the light receiving region 22 is reduced, namely that the photo-electric current flowing through the central portion in the light receiving region 22 is reduced.

Because the second p-type portion 15 of the p-type region 6 is formed up to the inner side of the light absorption layer 4 beyond the interface between the light absorption layer 4 and the window layer 5, if excessive light is incident on the p-type region 6 formed in the light receiving region 22, the semiconductor light-receiving element 50 of Embodiment 2 can suppress the deterioration in characteristics more significantly than the semiconductor light-receiving element 50 of Embodiment 1 does. More detailed description will be given below. According to the semiconductor light-receiving element 50 of Embodiment 2, when light is incident on the p-type region 6 formed in the light receiving region 22, a photo-electric current always flows through the second p-type portion 15 that is larger than that flowing through the first p-type portion 14. Thus, if excessive light is incident on the p-type region 6, the photo-electric current flowing through the second p-type portion 15 in the light receiving region 22 will increase accordingly so that if an excessive current is generated, the photo-electric current is less likely to concentrate in the first p-type portion 14 in the light receiving region 22 and thus the deterioration in characteristics due to generated heat can be suppressed, more significantly than in the case of the semiconductor light receiving element 50 of Embodiment 1.

As described above, like the semiconductor light-receiving element 50 of Embodiment 1, the semiconductor light-receiving element 50 of Embodiment 2 is provided with the p-type region 6 which has the first p-type portion 14 and the second p-type portion 15 whose diffusion front is deeper than that of the first p-type portion 14, and thus it achieves an effect similar to that of the semiconductor light-receiving element 50 of Embodiment 1. Further, according to the semiconductor light-receiving element 50 of Embodiment 2, because the second p-type portion 15 of the p-type region 6 is formed up to the inner side of the light absorption layer 4 beyond the interface between the light absorption layer 4 and the window layer 5, if an excessive current is generated, the photo-electric current is less likely to concentrate in the first p-type portion 14 in the light receiving region 22 and thus the deterioration in characteristics due to generated heat can be suppressed, more significantly than in the case of the semiconductor light receiving element 50 of Embodiment 1.

Embodiment 3

Figure 13:
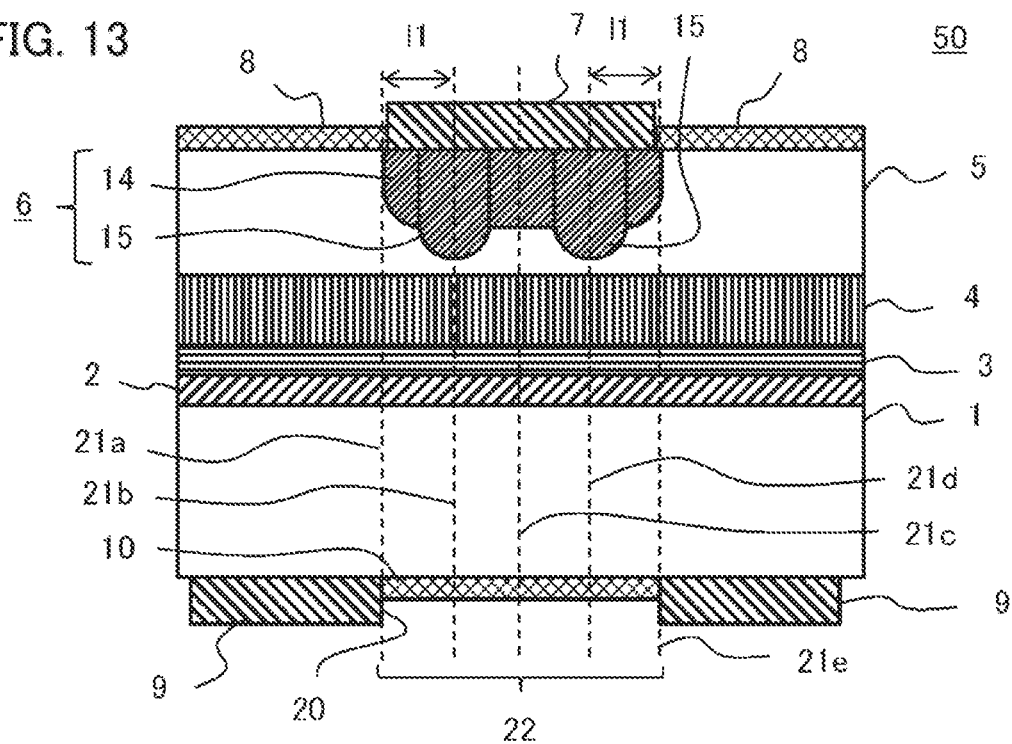
FIG. 13 is a sectional view showing a schematic configuration of a semiconductor light-receiving element according to Embodiment 3.
Figure 14:
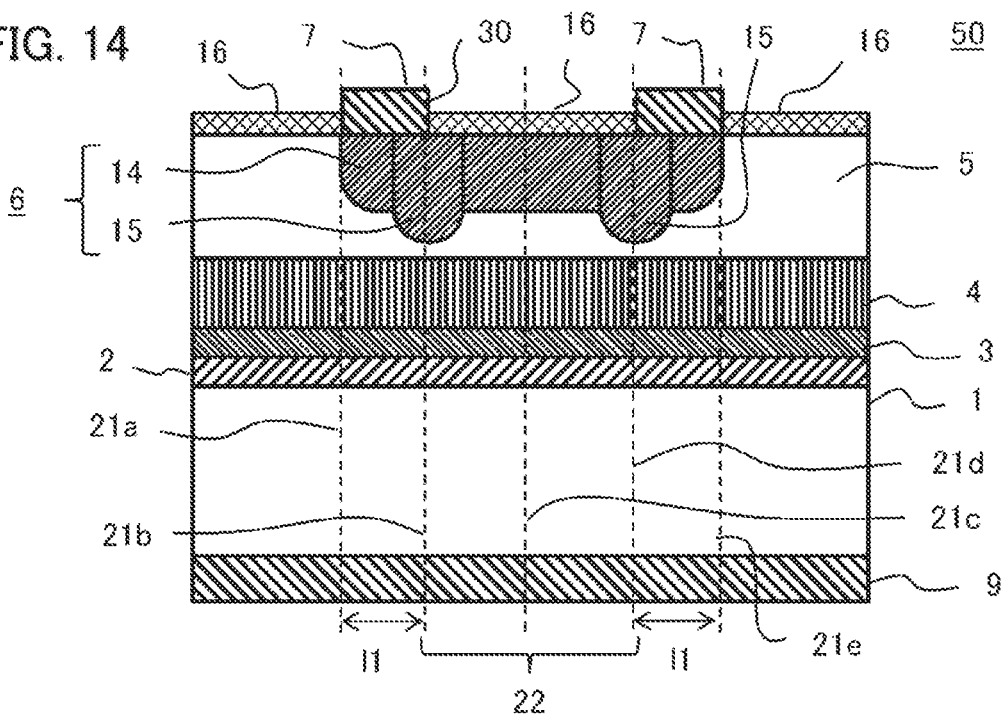
FIG. 14 is a sectional view showing a schematic configuration of another semiconductor light-receiving element according to Embodiment 3.

FIG. 13 is a sectional view showing a schematic configuration of a semiconductor light-receiving element according to Embodiment 3, and FIG. 14 is a sectional view showing a schematic configuration of another semiconductor light-receiving element according to Embodiment 3. Each semiconductor light-receiving element 50 of Embodiment 3 differs from the semiconductor light-receiving element 50 of Embodiment 1 in that the second p-type portion 15 of the p-type region 6 is formed into a ring shape interposed between an outer periphery of the p-type region 6 in the radial direction and the center thereof (central axis 21c). Further, according to the semiconductor light-receiving element 50 of Embodiment 3, it can be said that another first p-type portion 14 is further formed on an outer periphery of the second p-type portion 15 in the radial direction and, it can also be said that the second p-type portion 15 is formed to be displaced toward the central axis 21c from the outermost peripheral portion of the p-type region 6 in the radial direction. The structure other than the above is similar to that in the semiconductor light-receiving element 50 of Embodiment 1. The outer periphery of the p-type region 6 is a portion along which a broken line 21a passes and also a portion along which a broken line 21e passes, and the center of the p-type region 6 is a portion along which a broken line 21c passes. The semiconductor light-receiving element 50 shown in FIG. 13 is an avalanche photodiode of a back-surface incident type, and the semiconductor light-receiving element 50 shown in FIG. 14 is an avalanche photodiode of a front-surface incident type.

Like the semiconductor light-receiving element 50 of Embodiment 1, the semiconductor light-receiving element 50 of Embodiment 3 is provided with the p-type region 6 which has the first p-type portion 14 and the second p-type portion 15 whose diffusion front is deeper than that of the first p-type portion 14, and thus it achieves an effect similar to that of the semiconductor light-receiving element 50 of Embodiment 1.

Further, according to the semiconductor light-receiving element 50 of Embodiment 3, an outer periphery of the first p-type portion 14 that is the outer periphery of the p-type region 6, is apart from the periphery of the second p-type portion 15, and a deepest-portion distance 11, that is a distance between the broken line 21a that passes along the outer periphery of the p-type region 6 and a broken line 21b that passes through a deepest diffusion front of the second p-type portion 15, is longer than that of the semiconductor light-receiving element 50 of Embodiment 1. Likewise, according to the semiconductor light-receiving element 50 of Embodiment 3, another deepest-portion distance 11, that is a distance between the broken line 21e that passes along the outer periphery of the p-type region 6 and a broken line 21d that passes through a deepest diffusion front of the second p-type portion 15, is longer than that of the semiconductor light-receiving element 50 of Embodiment 1. According to the semiconductor light-receiving element 50 of Embodiment 3, because the deepest-portion distance l1 is longer than that of the semiconductor light-receiving element 50 of Embodiment 1, it is possible to make the shape of an outer peripheral portion of the p-type region 6, namely the shape of either a region from the broken line 21a to the broken line 21b and a region from the broken line 21d to the broken line 21e, more moderate than in the case of the semiconductor light-receiving element 50 of Embodiment 1, so that electric-field concentration in the outer peripheral portion of the p-type region 6 can be reduced more significantly than in the case of the semiconductor light-receiving element 50 of Embodiment 1. When focusing on the curvature of the shape of an outer peripheral portion of the p-type region 6, the semiconductor light-receiving element 50 of Embodiment 3 can make the curvature of the outer periphery portion of the p-type region 6, smaller than in the case of the semiconductor light-receiving element 50 of Embodiment 1.

Because the shape of the outer peripheral portion of the p-type region 6 is more moderate than in the case of the semiconductor light-receiving element 50 of Embodiment 1, the semiconductor light-receiving element 50 of Embodiment 3 can suppress edge breakdown at an edge portion of the light receiving region 22, more significantly than the semiconductor light-receiving element 50 of Embodiment 1 does.

Embodiment 4

Figure 15:
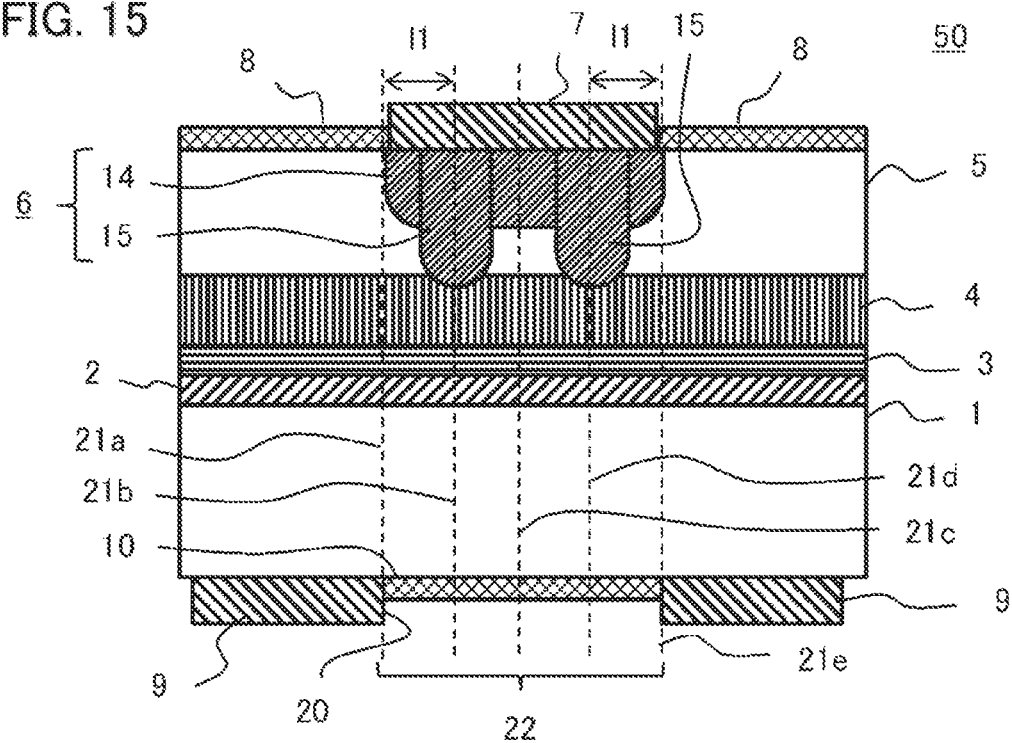
FIG. 15 is a sectional view showing a schematic configuration of a semiconductor light-receiving element according to Embodiment 4.
Figure 16:
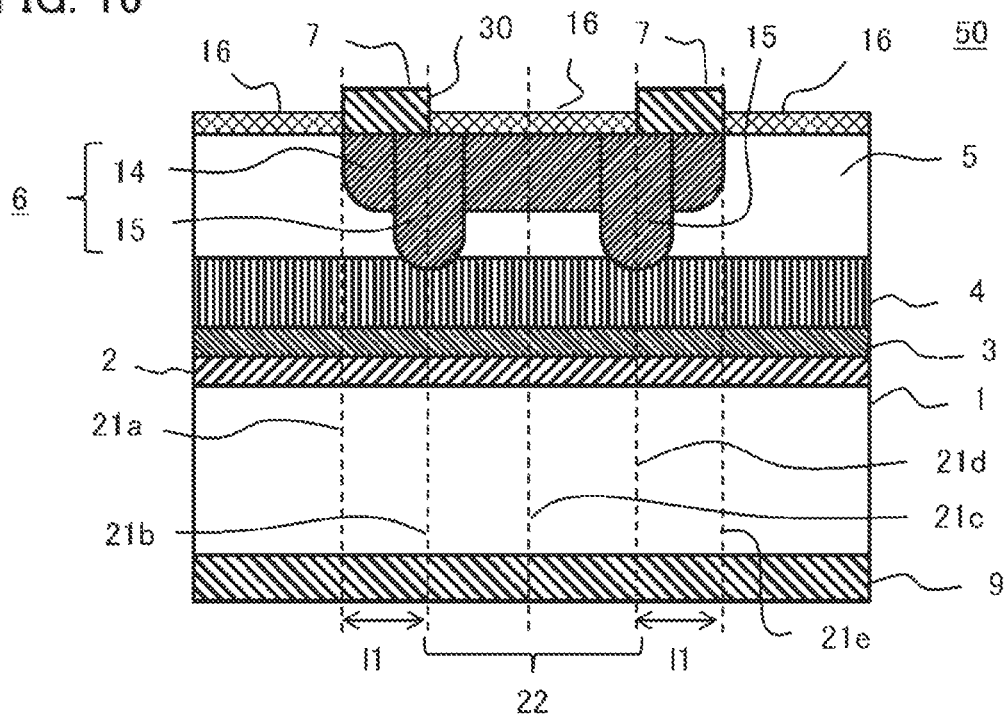
FIG. 16 is a sectional view showing a schematic configuration of another semiconductor light-receiving element according to Embodiment 4.

FIG. 15 is a sectional view showing a schematic configuration of a semiconductor light-receiving element according to Embodiment 4, and FIG. 16 is a sectional view showing a schematic configuration of another semiconductor light-receiving element according to Embodiment 4. Each semiconductor light-receiving element 50 of Embodiment 4 differs from the semiconductor light-receiving element 50 of Embodiment 3 in that the diffusion front of the second p-type portion 15 of the p-type region 6 is formed in the light absorption layer 4. The structure other than the above is similar to that in the semiconductor light-receiving element 50 of Embodiment 3. The semiconductor light-receiving element 50 shown in FIG. 15 is an avalanche photodiode of a back-surface incident type, and the semiconductor light-receiving element 50 shown in FIG. 16 is an avalanche photodiode of a front-surface incident type. Note that the semiconductor light-receiving element 50 of Embodiment 4 results from combining the structure of the semiconductor light-receiving element 50 of Embodiment 3 and the structure of the semiconductor light-receiving element 50 of Embodiment 2.

Like the semiconductor light-receiving element 50 of Embodiment 1, the semiconductor light-receiving element 50 of Embodiment 4 is provided with the p-type region 6 which has the first p-type portion 14 and the second p-type portion 15 whose diffusion front is deeper than that of the first p-type portion 14, and thus it achieves an effect, similar to that of the semiconductor light-receiving element 50 of Embodiment 1. Further, according to the semiconductor light-receiving element 50 of Embodiment 4, like in the semiconductor light-receiving element 50 of Embodiment 3, an outer periphery of the first p-type portion 14 that is the outer periphery of the p-type region 6, is apart from the periphery of the second p-type portion 15, and the deepest-portion distance 11 is longer than that of the semiconductor light-receiving element 50 of Embodiment 1. Thus, it is possible to make the shape of an outer peripheral portion of the p-type region 6, more moderate than in the case of the semiconductor light-receiving element 50 of Embodiment 1, so that electric-field concentration in the outer peripheral portion of the p-type region 6 can be reduced more significantly than in the case of the semiconductor light-receiving element 50 of Embodiment 1.

Furthermore, according to the semiconductor light-receiving element 50 of Embodiment 4, like in the semiconductor light receiving element 50 of Embodiment 2, the diffusion front of the second p-type portion 15 of the p-type region 6 is formed in the light absorption layer 4. Thus, a path through which a photo-electric current easily flows can be formed at other than the central portion in the light receiving region 22. Therefore, according to the semiconductor light-receiving element 50 of Embodiment 4, the multiplication factor of the central portion (the first p-type portion 14 placed inwardly from the second p-type portion 15) in the light receiving region 22 decreases more significantly than in the case of the semiconductor light-receiving element 50 of Embodiment 3, so that, if an excessive current is generated, the photo-electric current is less likely to concentrate in the first p-type portion 14 in the light receiving region 22 and thus the deterioration in characteristics due to generated heat can be suppressed, more significantly than in the case of the semiconductor light receiving element 50 of Embodiment 3.

According to the semiconductor light-receiving element 50 of Embodiment 4, because it results from combining the structure of the semiconductor light-receiving element 50 of Embodiment 3 and the structure of the semiconductor light-receiving element 50 of Embodiment 2, if excessive light is incident on the p-type region 6, it is possible to suppress edge breakdown at an edge portion of the light receiving region 22, while suppressing the deterioration in characteristics due to generated heat.

Embodiment 5

Figure 17:
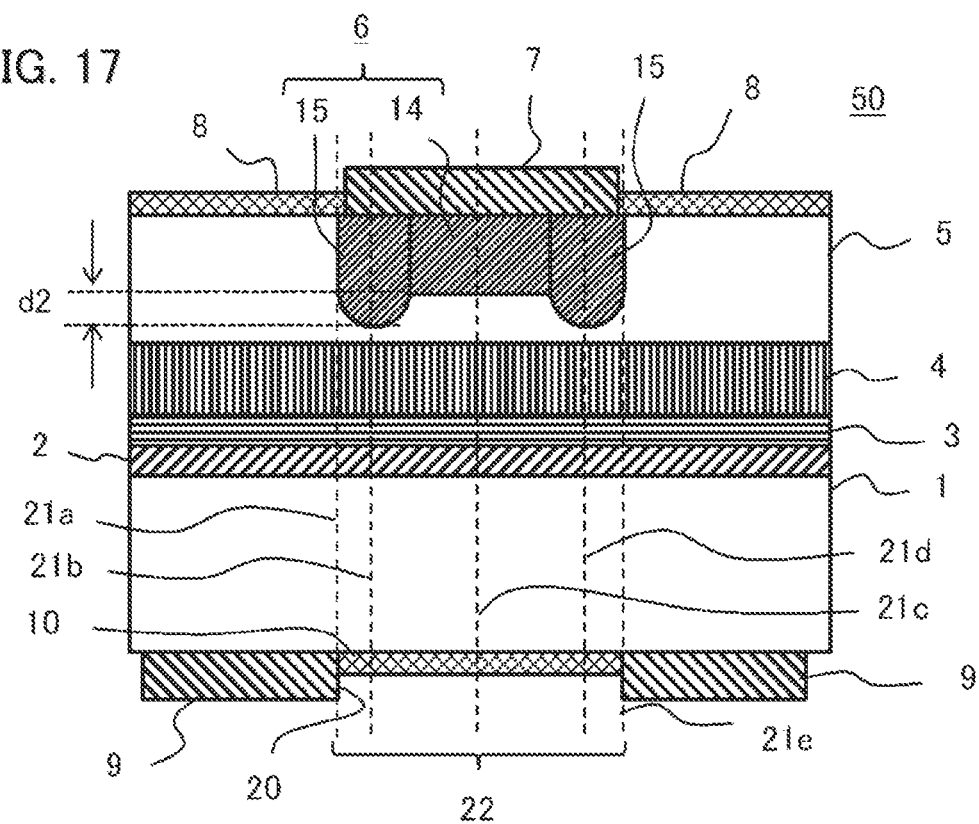
FIG. 17 is a sectional view showing a schematic configuration of a semiconductor light-receiving element according to Embodiment 5.
Figure 18:
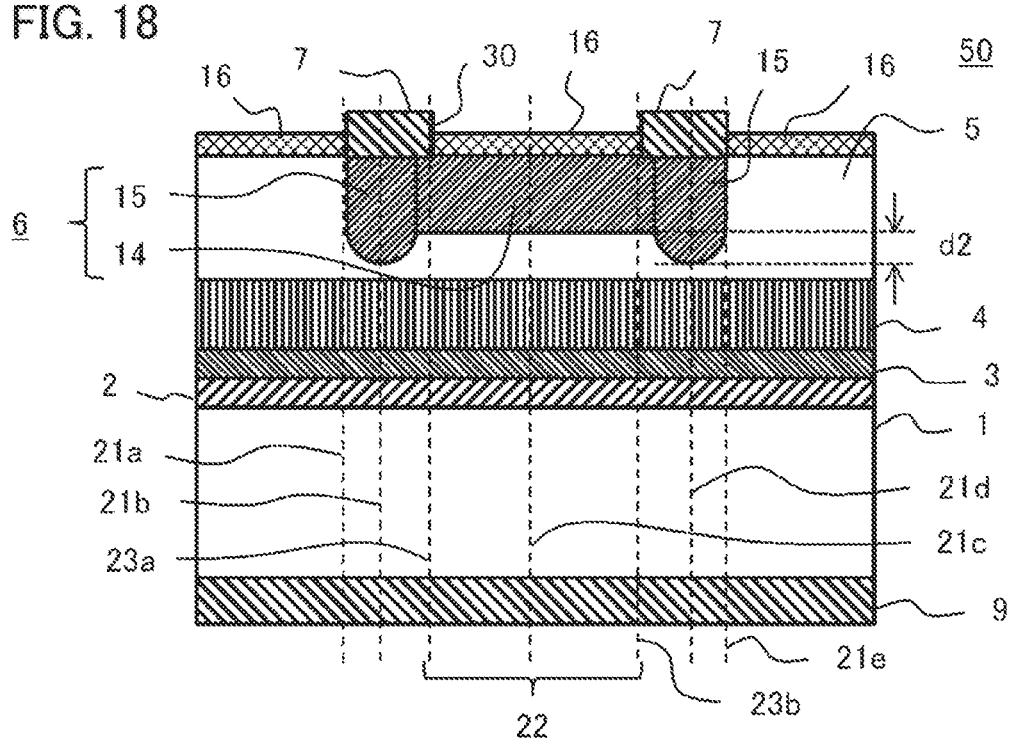
FIG. 18 is a sectional view showing a schematic configuration of another semiconductor light-receiving element according to Embodiment 5.

FIG. 17 is a sectional view showing a schematic configuration of a semiconductor light-receiving element according to Embodiment 5, and FIG. 18 is a sectional view showing a schematic configuration of another semiconductor light-receiving element according to Embodiment 5. Each semiconductor light-receiving element 50 of Embodiment 5 differs from the semiconductor light-receiving element 50 of Embodiment 1 in that the diffusion-front difference that is a distance between the diffusion front of the first p-type portion 14 and the diffusion front of the second p-type portion 15, is a diffusion-front difference d2 of 100 nm or more. The structure other than the above is similar to that in the semiconductor light-receiving element 50 of Embodiment 1. The semiconductor light-receiving element 50 shown in FIG. 17 is an avalanche photodiode of a back-surface incident type, and the semiconductor light-receiving element 50 shown in FIG. 18 is an avalanche photodiode of a front-surface incident type. According to one exemplary calculation, when the diffusion-front difference as a distance between the diffusion front of the first p-type portion 14 and the diffusion front of the second p-type portion 15 is 100 nm or more, the multiplication factor of the central portion (the first p-type portion 14 placed inwardly from the second p-type portion 15) in the light receiving region 22 can be lowered from 9.6 to 6.7, so that the photo-electric current flowing through the central portion in the light receiving region 22 can be reduced by about 30%.

According to the semiconductor light-receiving element 50 of Embodiment 5, because the diffusion-front difference as a distance between the diffusion front of the first p-type portion 14 and the diffusion front of the second p-type portion 15 is 100 nm or more, the difference between the multiplication factor of the central portion in the light receiving region 22 and the multiplication factor of the outer peripheral portion therein, can be established more stably than in the case of the semiconductor light-receiving element 50 of Embodiment 1. When the structure in which the diffusion-front difference as a distance between the diffusion front of the first p-type portion 14 and the diffusion front of the second p-type portion 15 is 100 nm or more, is applied to the semiconductor light-receiving element 50 of Embodiment 3, the difference between the multiplication factor of the central portion in the light receiving region 22 and the multiplication factor of the outer peripheral portion therein, can be established more stably than in the case of the semiconductor fight-receiving element 50 of Embodiment 3.

Further, the structure in which the diffusion-front difference as a distance between the diffusion front of the first p-type portion 14 and the diffusion front of the second p-type portion 15 is 100 nm or more, may be applied to the semiconductor light-receiving element 50 of Embodiment 2 or the semiconductor light-receiving element 50 of Embodiment 4. If this is the case, the difference between the multiplication factor of the central portion in the light receiving region 22 and the multiplication factor of the outer peripheral portion therein can be stably established as well.

Like the semiconductor light-receiving element 50 of Embodiment 1, the semiconductor light-receiving element 50 of Embodiment 5 is provided with the p-type region 6 which has the first p-type portion 14 and the second p-type portion 15 whose diffusion front is deeper than that of the first p-type portion 14, and thus it achieves an effect similar to that of the semiconductor light-receiving element 50 of Embodiment 1. Furthermore, according to the semiconductor light-receiving element 50 of Embodiment 5, because the diffusion-front difference as a distance between the diffusion front of the first p-type portion 14 and the diffusion front of the second p-type portion 15 is 100 nm or more, the difference between the multiplication factor of the central portion in the light receiving region 22 and the multiplication factor of the outer peripheral portion therein, can be established more stably than in the case of the semiconductor light-receiving element 50 of Embodiment 1.

It is noted that, in this application, a variety of exemplary embodiments and examples are described; however, every characteristic, configuration or function that is described in one or more embodiments, is not limited to being applied to a specific embodiment, and may be applied singularly or in any of various combinations thereof to another embodiment. Accordingly, an infinite number of modified examples that are not exemplified here are supposed within the technical scope disclosed in the present description. For example, such cases shall be included where at least one configuration element is modified; where any configuration element is added or omitted; and furthermore, where at least one configuration element is extracted and combined with a configuration element of another embodiment.

DESCRIPTION OF REFERENCE NUMERALS AND SIGNS

1: semiconductor substrate, 2: multiplication layer, 3: electric-field control layer, 4: light absorption layer, 5: window layer, 6: p-type region, 14: first p-type portion, 15: second p-type portion, 21c: broken line (central axis), 50: semiconductor light-receiving element, d1: diffusion-front difference (differential distance), d2: diffusion-front difference (differential distance).

The invention claimed is:

1. A semiconductor light-receiving element in which a multiplication layer, an electric-field control layer, a light absorption layer and a window layer are sequentially formed on a semiconductor substrate, and a p-type region is formed in the window layer,
    wherein the p-type region has a first p-type portion and a second p-type portion whose current multiplication factor due to light incidence is larger than that of the first p-type portion;
    wherein the first p-type portion is formed as a central portion of the p-type region, said central portion including a central axis perpendicular to the semiconductor substrate; and
    wherein the second p-type portion is formed on an outer periphery of the central portion in a radial direction about the central axis.

2. The semiconductor light-receiving element of claim 1, wherein the second p-type portion extends toward the semiconductor substrate further than the first p-type portion.

3. The semiconductor light-receiving element of claim 2, wherein the second p-type portion is formed to extend into the light absorption layer.

4. The semiconductor light-receiving element of claim 2, wherein another first p-type portion is further formed on an outer periphery of the second p-type portion in the radial direction.

5. The semiconductor light-receiving element of claim 2, wherein the second p-type portion is formed so that it is displaced toward the central axis from an outermost peripheral portion of the p-type region in the radial direction, and extends toward the semiconductor substrate further than the outermost peripheral portion.

6. The semiconductor light-receiving element of claim 1, wherein the second p-type portion is formed to extend into the light absorption layer.

7. The semiconductor light-receiving element of claim 6, wherein another first p-type portion is further formed on an outer periphery of the second p-type portion in the radial direction.

8. The semiconductor light-receiving element of claim 6, wherein the second p-type portion is formed so that it is displaced toward the central axis from an outermost peripheral portion of the p-type region in the radial direction, and extends toward the semiconductor substrate further than the outermost peripheral portion.

9. The semiconductor light-receiving element of claim 1, wherein the second p-type portion is formed as an outermost peripheral portion of the p-type region in the radial direction.

10. The semiconductor light-receiving element of claim 1, wherein another first p-type portion is further formed on an outer periphery of the second p-type portion in the radial direction.

11. The semiconductor light-receiving element of claim 1, wherein the second p-type portion is formed so that it is displaced toward the central axis from an outermost peripheral portion of the p-type region in the radial direction, and extends toward the semiconductor substrate further than the outermost peripheral portion.

12. The semiconductor light-receiving element of claim 1, wherein the multiplication layer contains aluminum.

13. The semiconductor light-receiving element of claim 1, wherein the p-type region contains zinc.

14. The semiconductor light-receiving element of claim 1, wherein the p-type region is a zinc-diffused region.

15. The semiconductor light-receiving element of claim 1, wherein, with respect to an end portion in the first p-type portion that is closest to the semiconductor substrate and an end portion in the second p-type portion that is closest to the semiconductor substrate, a differential distance in a direction of the central axis between these end portions is 100 nm or more.

16. The semiconductor light-receiving element of claim 1, wherein an impurity concentration of the p-type region is $1 \times 10^{18}$ cm$^{-3}$ or more.

17. A semiconductor light-receiving element manufacturing method of manufacturing the semiconductor light-receiving element of claim 1, comprising:
- a step of forming the multiplication layer, the electric-field control layer, the light absorption layer and the window layer, sequentially on the semiconductor substrate;
- a second p-type portion formation step of forming the second p-type portion of the p-type region; and
- a first p-type portion formation step of forming, after the second p-type portion formation step, the first p-type portion of the p-type region.

18. A semiconductor light-receiving element manufacturing method of manufacturing a semiconductor light-receiving element which comprises a semiconductor substrate, a multiplication layer, an electric-field control layer, a light absorption layer and a window layer, and in which a p-type region is formed in the window layer, said p-type region having a first p-type portion and a second p-type portion whose current multiplication factor due to light incidence is larger than that of the first p-type portion,
said semiconductor light-receiving element manufacturing method comprising:
- a step of stacking the multiplication layer, the electric-field control layer, the light absorption layer and the window layer, sequentially on the semiconductor substrate, to thereby form a layered body;
- a second p-type portion formation step of forming the second p-type portion of the p-type region; and
- a first p-type portion formation step of forming, after the second p-type portion formation step, the first p-type portion of the p-type region.

19. The semiconductor light-receiving element manufacturing method of claim 18, wherein the first p-type portion formation step and the second p-type portion formation step are performed in such a manner that zinc is diffused into the layered body.

20. The semiconductor light-receiving element manufacturing method of claim 18, wherein the second p-type portion is formed to extend into the light absorption layer.

* * * * *